United States Patent [19]

Juen

[11] Patent Number: 4,977,312
[45] Date of Patent: Dec. 11, 1990

[54] PHOTOMETRIC APPARATUS EMPLOYING SOLID-STATE IMAGING DEVICE

[75] Inventor: Masahiro Juen, Yokohama, Japan
[73] Assignee: Nikon Corporation, Tokyo, Japan
[21] Appl. No.: 419,116
[22] Filed: Oct. 10, 1989

[30] Foreign Application Priority Data

Oct. 18, 1988 [JP] Japan .................................. 63-262367

[51] Int. Cl.⁵ .............................................. H01J 40/14
[52] U.S. Cl. .................................. 250/208.1; 250/211 J
[58] Field of Search ........................... 250/208.1, 211 J; 357/30 H, 24 LR, 20; 358/213.26

[56] References Cited

U.S. PATENT DOCUMENTS 4,626,915 12/1986 Takatsu ................................. 358/213
4,879,470 11/1989 Sugawa et al. .................... 250/208.1

Primary Examiner—David C. Nelms
Attorney, Agent, or Firm—Shapiro and Shapiro

[57] ABSTRACT

A photometric apparatus has a solid-state imaging device whose substrate is formed as an overflow drain, a drive stopping circuit for stopping the driving of the solid-state imaging device with no bias being applied, and a photometric circuit for measuring a photoelectric current which flows from each photodiode into the overflow drain in correspondence with an image of an object. An electrode which is formed to cover the entire substrate surface of the solid-state imaging device may be composed of a plurality of electrode segments which correspond to photometric regions into which are divided one viewfinder field.

14 Claims, 4 Drawing Sheets

HORIZONTAL SHIFT RESISTER

PHOTOMETRIC APPARATUS EMPLOYING SOLID-STATE IMAGING DEVICE

BACKGROUND OF THE INVENTION

1. Field of the Invention

The present invention relates to a photometric apparatus of the type employing a solid-state imaging device provided with a vertical overflow drain.

2. Related Background Art

Various types of cameras have conventionally been available such as silver-salt still cameras of the type which record still images by using silver salt film, silver-salt movie cameras of the type which record motion images by using silver salt film, electronic still cameras of the type which record still images by using imaging devices and electronic memories such as magnetic floppy discs or the like, and video cameras of the type which record motion images by using imaging devices and magnetic tapes. Any of the above noted types of cameras is provided with a photometric apparatus for optimizing the amount of exposure with respect to film or the imaging device. For example, in the case of a particular type of electronic still camera which utilizes an imaging CCD as a photometric apparatus, the CCD is driven at the timing of photometry which is executed in response to a photographic operation and, as in a video camera for recording a motion image, during the driving of the CCD, photometry is effected while a diaphragm for exposure control is being controlled in order to supplement an insufficiency in the dynamic range thereof. In other words, in accordance with such a prior art, it has been necessary that CCD driving or diaphragm control be performed not only during exposure control but at the timing of photometry. As a result, the time period during which the CCD is driven in one photographic cycle is long and power dissipation therefore increases. This results in a reduction in the time period during which the camera can operate with a battery supply alone.

A similar problem occurs even when such a photometric apparatus is used in any camera other than the electronic still camera. In addition, even a conventional photometric system which does not utilize an imaging device as a photometric apparatus encounters a problem similar to the above-described one because any conventional type of camera is substantially the same in that a large amount of electrical power is consumed for the purpose of photometry.

An exposure-amount determining system is known in which one viewfinder field is divided into a plurality of sections so that a proper amount of exposure is determined by metering the brightnesses of the individual sections, selecting and combining the outputs therefrom, and effecting predetermined processes such as weighting, arithmetic operations and the like. (This exposure-amount determining system is hereinafter referred to as "multi-pattern photometric system"). If the photoconductive surface of an imaging CCD is constructed of a plurality of photoconductive segments in order to realize the multi-pattern photometric system with the imaging CCD, a signal processing circuit is needed for outputting the photometric outputs of the individual photoconductive segments at high speed. This signal processing circuit, however, increases the complexity of the entire circuit arrangement.

FIG. 7 is a schematic view showing a CCD of the horizontal overflow drain type which has heretofore been commonly used, and shows a structure in which photometry is performed through the photo-conductive surface of the CCD, consisting of a plurality of photoconductive segments. Reference numerals 71, 72, 73 and 74 denote electrode segments serving as overflow drains, and these electrode segments are employed for photometry utilizing photosensitive pixels a, b, c and d. In the case of such a structure, it is necessary that a plurality of overflow drains be separately formed on the device surface and, in addition, the separate overflow drains must be connected with no photo-sensitive pixels being covered. Accordingly, the process of producing such a device has required critical techniques for processing extremely fine portions, thus resulting in the problem that the yield and performance of devices becomes low.

SUMMARY OF THE INVENTION

It is, therefore, an object of the present invention to provide a photometric apparatus capable of determining the amount of exposure without an increase in power dissipation.

It is another object of the present invention to provide a photometric apparatus suitable for use in realizing multi-pattern photometry without the need for a complex circuit and critical techniques for processing extremely fine portions.

In order to achieve the above-described objects, in accordance with the present invention, the substrate of a solid-state imaging device is formed as an overflow drain. More specifically, a general type of solid-state imaging device having a vertical overflow drain structure is prepared, and it is arranged so that the driving of it is completely stopped by a drive stopping means, that is, so that the imaging device is placed in a stop state in which no bias is applied. In this complete stop state, measuring means are caused to measure a photoelectric current which flows from photodiodes, each forming a photosensitive pixel, into the overflow drain in accordance with the brightness distribution of an image of an object which is focused on the photosensitive portion of the device. In addition, if an arrangement in which the amount of exposure is determined on the basis of this measurement output is adopted, automatic exposure control is enabled.

In the photometric apparatus having such a construction, the operation of the CCD is completely stopped at the timing of photometry with no bias applied thereto, and the photoelectric current which flows from the photosensitive portion into the overflow drain is measured. Accordingly, it is possible to effect photometry without increasing power dissipation.

Moreover, it is possible that the electrode formed to cover the entire substrate surface of the solid-state imaging device be composed of a plurality of electrode segments which correspond to photometric regions into which are divided one viewfinder field. If means for measuring a photoelectric current which flows into the overflow drain while the driving of the solid-stage imaging device is being stopped is provided for each individual electrode segment, a photometric apparatus capable of multi-pattern photometry is realized with a simple device structure and without the need for critical techniques for processing fine portions.

In the photometric apparatus having the above-described construction, it is possible to arbitrarily set various photometric modes such as center-weighted metering mode for metering the brightness only at the center of a viewfinder field, average metering mode for metering the brightness over the entire viewfinder field and the like. More specifically, if the substrate electrode of the CCD is composed of isolated segments corresponding to the individual photometric regions set in the viewfinder field so that the photoelectric current which flows from each electrode segment into the overflow drain is measured, it is possible to realize a multi-pattern metering system which determines optimum photographic conditions through selection, combination, weighting, arithmetic operations and the like of the measurement results.

DETAILED DESCRIPTION OF THE PREFERRED EMBODIMENT

An embodiment of the present invention will be described below with reference to the accompanying drawings.

Figure 1:
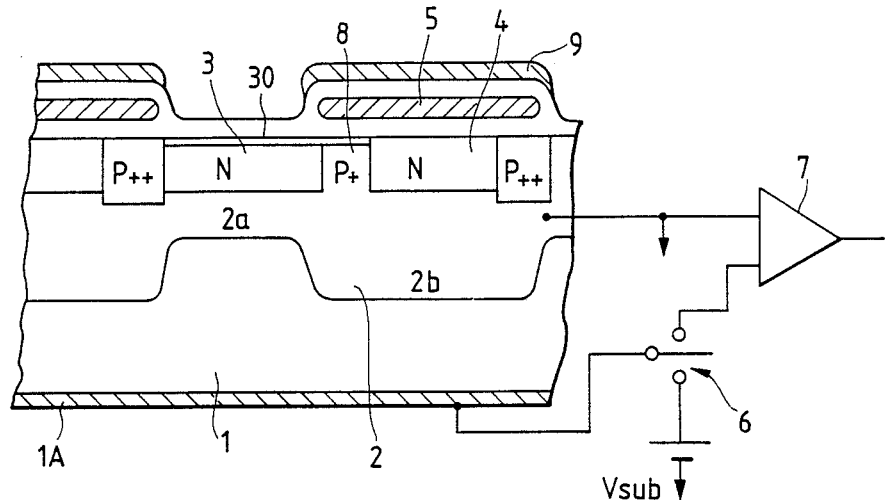
FIG. 1 is a partial cross-sectional view which serves to illustrate the principle of photometry according to the present invention.

FIG. 1 is a schematic view which serves to illustrate the principle of a photometric apparatus according to the present invention, showing in cross section an imaging portion and a photometric circuit of an interline-type CCD which constitutes a solid-state imaging device. First of all, the imaging portion of the interline-type CCD is explained with reference to FIG. 1. Reference numeral 1 denotes an n-type silicon substrate (n-type substrate), and an electrode 1A is formed on one surface of the n-type silicon substrate 1 (the bottom surface thereof as viewed in the figure), and a p-type region 2 is formed on the surface of the n-type silicon substrate 1 which is opposite to the aforesaid one surface. As illustrated, this p-type region 2 includes a p layer 2a and a p well 2b. A photoelectric-charge accumulation layer 3, which forms photosensitive pixels for photoelectric conversion, is formed on the side of the p layer 2a which is opposite to the n-type silicon substrate 1, while a vertical CCD transfer resistor 4 is formed on the side of the p well 2b which is opposite to the n-type silicon substrate 1. A transfer gate 8 is formed between the photoelectric-charge accumulation layer 3 and the vertical CCD transfer register 4, and a thin p-type layer 30 is formed to cover the photoelectric-charge accumulation layer 3 and the vertical CCD transfer register 4. An isolation layer made of $SiO_2$ overlies the photoelectric-charge accumulation layer 3 and the vertical CCD transfer register 4. A transfer register electrode 5 is formed in the portion of the $SiO_2$ isolation layer which corresponds to the vertical CCD transfer register 4, and a light shielding layer 9 is formed to cover the vertical CCD transfer register 4 and the transfer gate 8. Moreover, in accordance with the present invention, a current-to-voltage conversion amplifier 7 is provided as a photometric circuit section which is suitably used in combination with the imaging section of the above-described interline-type CCD having the above-described structure. The p-type region 2 is connected to one of the input terminals of the current-to-voltage conversion amplifier 7. The electrode 1A formed on the n-type silicon substrate 1 is selectively connected to the other input terminal of the current-to-voltage conversion amplifier 7 or a bias supply $V_{SUB}$ by means of a selecting switch 6.

While the solid-state imaging device consisting of the interline-type CCD shown in FIG. 1 is being driven, the selecting switch 6 is switched to a side connected to the bias supply $V_{SUB}$ to apply a bias voltage $V_{SUB}$ to the substrate 1. During this time, drive pulses for transfer purposes are being applied to the transfer register electrode 5 of the vertical CCD transfer register 4.

Figure 2:
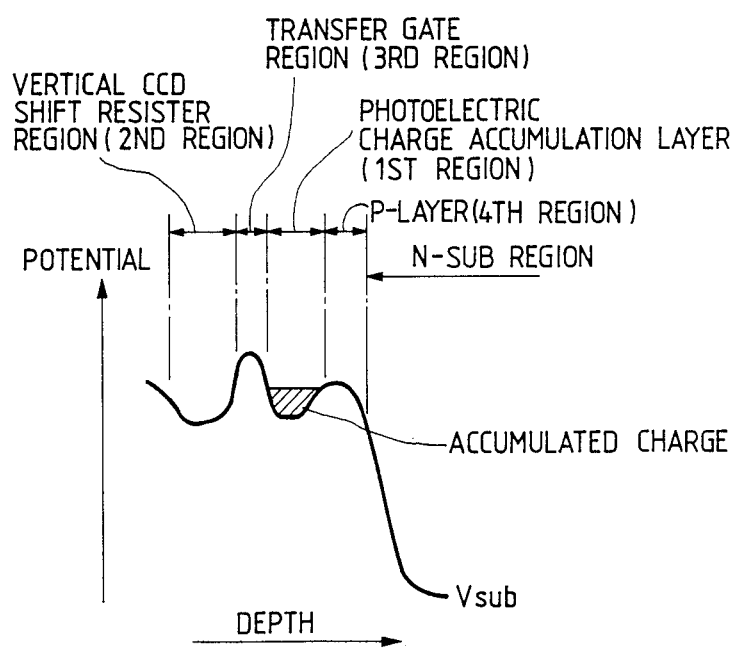
FIG. 2 is a graphic representation which shows the potential distribution appearing while the CCD of FIG. 1 is being driven.

FIG. 2 shows a potential distribution appearing while the interline-type CCD of FIG. 1 is being driven. As can be seen from the potential distribution of FIG. 2 which appears while the interline-type CCD is being driven, if signal charges, which are generated in the photoelectric-charge accumulation layer 3 by illumination from the outside, pass through the $p$ layer 2a in the p-type region 2, then the signal charges flow into the bias supply $V_{SUB}$ which is applying a bias voltage to the electrode 1A of the n-type silicon substrate 1, but they do not enter the vertical CCD transfer register 4. Accordingly, so-called blooming does not take place.

The n-type silicon substrate 1 the structure of which has a potential distribution such as that shown in FIG. 2 is hereinafter referred to as a vertical overflow drain (OFD). While such an n-type silicon substrate 1, that is, an interline-type CCD the substrate of which forms a vertical overflow drain, is being driven, the maximum number of electric charges to be accumulated in the photo-electric-charge accumulation layer 3 is limited. It follows, therefore, that the interline-type CCD including the vertical overflow drain has a limited dynamic range, within which the amount of exposure is determined by transferring the charges generated in the photoelectric-charge accumulation layer 3 to the outside through the vertical CCD transfer register 4. In contrast, if the photoelectric charges are not read into the vertical CCD transfer register 4, they overflows from the photoelectric-charge accumulation layer 3 to form a photoelectric current which flows into the n-type silicon substrate 1 the overflow drain. Such an overflow occurs in all the photosensitive pixels the photoelectric-charge accumulation layer 3. As a result, the amount of electric current which flows into the overflow drain is proportional to the quantity of light received by the photosensitive pixels.

However, the electric current which flows into the overflow drain while the bias voltage $V_{SUB}$ is being applied to the n-type silicon substrate 1 includes a large amount of dark current which is generated in a deep portion of the p-type region 2. For this reason, it is in effect difficult to measure the infinitesimal photoelectric current which flows out of the photoelectric-charge accumulation layer 3. In contrast, while the bias voltage $V_{SUB}$ is not being applied to the n-type silicon substrate 1, no dark current, which flows into the overflow drain, is generated. Accordingly, in a non-biased state, it is possible to measure the photoelectric current 4 which flows from the photoelectric-charge accumulation layer 3. Based on this finding, consideration is given hereinbelow to a state wherein, when application of drive pulses to the vertical CCD transfer register 4 is stopped, the bias applied to the overall p-type region 2 on the n-type silicon substrate 1 is set to zero at the same time.

Figure 3:
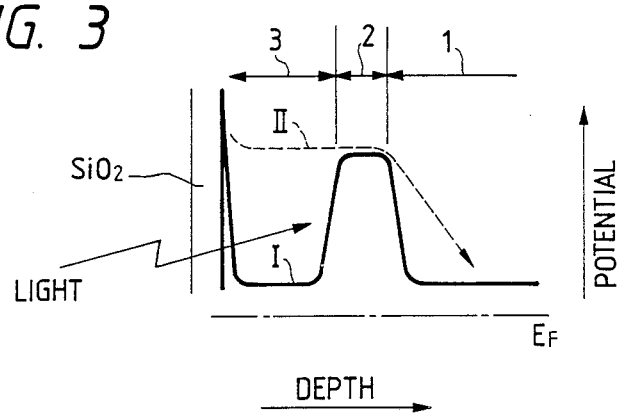
FIG. 3 is a view which serves to illustrate the potential appearing when the driving of the CCD of FIG. 1 is stopped and no bias is applied.

FIG. 3 is a graphic representation which shows the potential distribution measured along the depth in a conduction band immediately below the photoelectric-charge accumulation layer 3 when driving of the solid-state imaging device the interline-type CCD, is stopped and the bias is set to zero. In FIG. 3, Ef denotes a Felmi level in an equilibrium state wherein no light is externally incident. In a light-shielded state, the photo- electric-charge accumulation layer 3 is empty and therefore assumes the state of potential I shown in FIG. 3.

When light is externally incident on the photoelectric-charge accumulation layer 3, photoelectric charges are accumulated up to a potential level II in the photoelectric-charge accumulation layer 3. Thereafter, the accumulated photoelectric charges overflow beyond the p-type region 2 into the n-type silicon substrate 1 the substrate, as shown by a dashed line. In this state, if a short circuit is formed, between the p-type region 2 and the n-type silicon substrate 1, it follows that the amount of photoelectric current proportional to the quantity of light received flows out. Of course, it is expected that the photoelectric current generated in the photoelectric-charge accumulation layer 3 will overflow toward the vertical CCD transfer register 4. In this case, however, since the driving of the vertical CCD transfer register 4 is also stopped simultaneously, the electric charges which have overflown into the vertical CCD transfer register 4 also finally overflow into the n-type silicon substrate 1.

Figure 4:
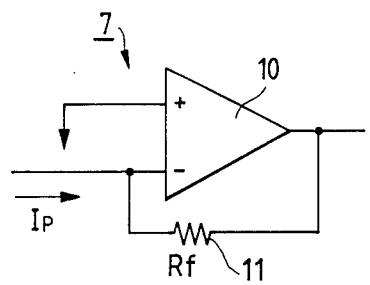
FIG. 4 is a circuit diagram showing the principle of a photometric circuit used in the present invention.

FIG. 4 is a circuit diagram which serves to illustrate the principle of the current-to-voltage conversion amplifier 7 shown in FIG. 1. This amplifier 7 is arranged to detect a photoelectric current which overflows into the n-type silicon substrate 1 during the complete stop state of the interline-type CCD shown in FIG. 3, that is to say, when the driving of the vertical CCD transfer register 4 is stopped and no bias is applied. In FIG. 4, reference numeral 10 denotes an operational amplifier used for low-input current biasing. If the release voltage gain of the operational amplifier 10 is extremely large, its output voltage $V_0$ is represented by:

$$V_0 = -Ip \cdot Rf$$

where Ip represents photoelectric current, and Rf represents feedback resistance. The input impedance takes on a value obtained by dividing the resistance Rf of a feedback resistor 11 by the release voltage gain. The input impedance can be rendered an extremely small value so that it can be considered that the short current between the p-type region 2 and the n-type silicon substrate 1 is approximately measured.

As shown on the device structure of FIG. 1, the electrode 1A for biasing the vertical overflow drain of the ordinary interline-type CCD is formed to cover the entire surface of the n-type silicon substrate 1 which constitutes the reverse surface of the CCD device. Accordingly, uniform bias is applied to the overall imaging surface of the CCD device.

Further, consideration is given to a case where the electrode 1A of the n-type silicon substrate 1 is composed of a plurality of electrode segments and the photoelectric current of each electrode segment is measured with the current-to-voltage conversion amplifier 7 shown in FIG. 4. In this case, as shown in FIG. 4, if the input impedance of the current-to-voltage conversion amplifier 7 is sufficiently small, a major portion of the photoelectric charges generated in one pixel a single photoelectric-charge accumulation layer 3, flows into the overflow drain electrode immediately below it. It is to be understood, therefore, that the number of photoelectric charges which diffuse in the horizontal direction is relatively small. Accordingly, in an arrangement in which the electrode 1A formed over the entire surface of the n-type silicon substrate 1 is composed of electrode segments, the photoelectric current, corresponding to each electrode segment, which flows into the overflow drain, directly reflects the two-dimensional pattern of light incident upon the imaging surface of the CCD device. Accordingly, if the electrode segments of the electrode 1A formed on the surface of the n-type silicon substrate 1 which corresponds to the reverse surface of the CCD device are each formed into an arbitrary configuration so that the outputs from the individual electrode segments are weighted or subjected to appropriate arithmetic operations, it becomes possible to readily set various types of photometric modes such as, for example, a center-weighted metering mode, a periphery-weighted metering mode, an average metering mode, and a multi-pattern metering mode (one kind of photometric system in which one viewfinder field is divided into a plurality of regions so that the outputs from the individual regions are computed to obtain a proper exposure value).

Figure 5:
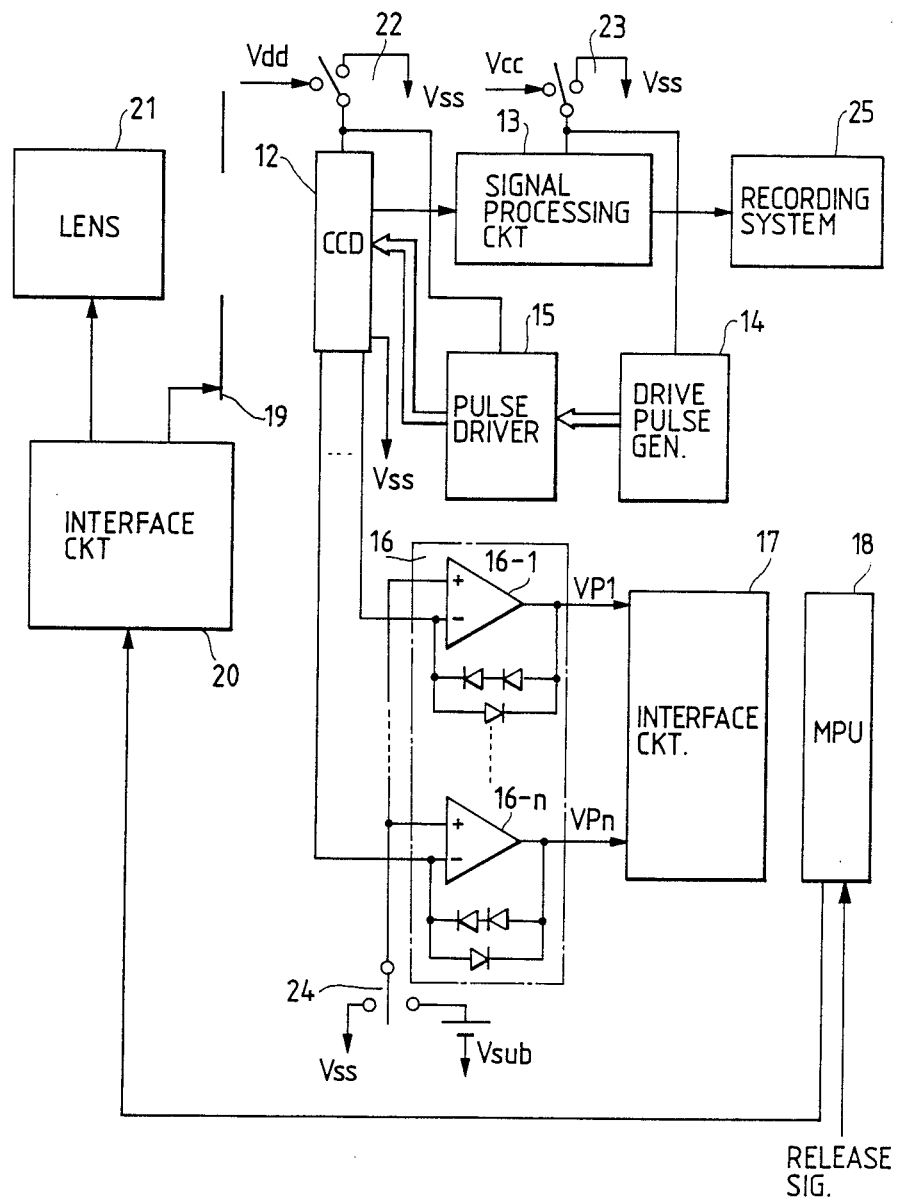
FIG. 5 is a circuit block diagram showing one embodiment of the present invention.
Figure 7:
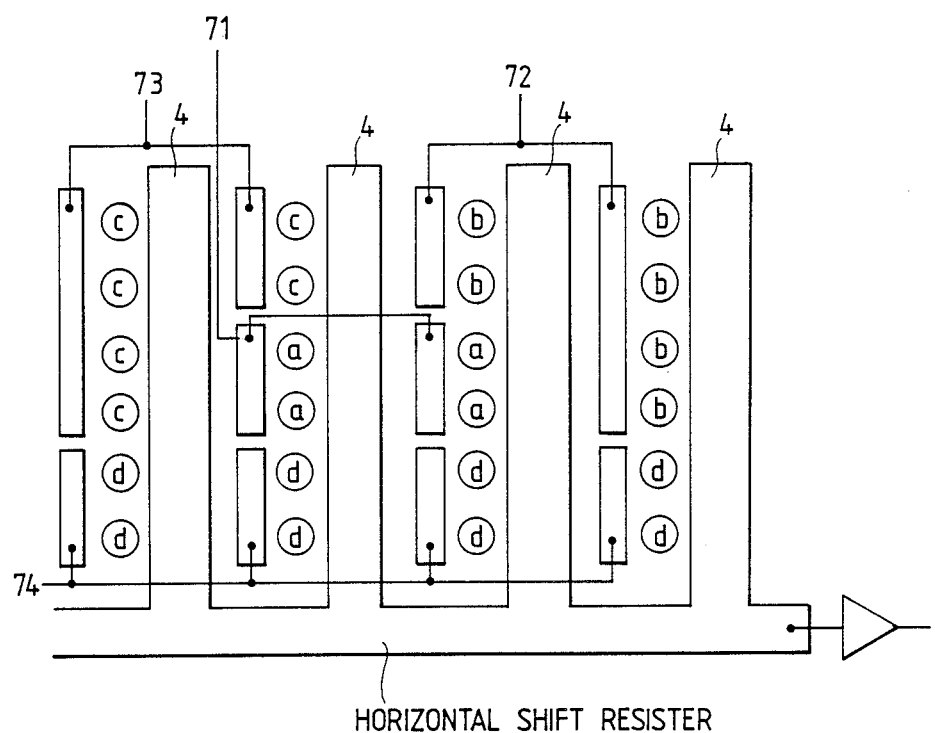
FIG. 7 is a schematic view shows a case where the photoconductive surface of a CCD having a horizontal overflow drain is made up of multiple photoconductive segments.

FIG. 5 is a circuit block diagram which serves to illustrate one embodiment of the present invention based on the photometric principle shown in FIGS. 1 to 4. An image of an object is focused on a solid-state imaging device 12 through a photographic lens 21 and a shutter 19. The solid-state imaging device 12 is driven by a drive-pulse generator 14 and a pulse driver 15. Photoelectric charges, which are accumulated in the photoelectric-charge accumulation layer the photosensitive pixels, throughout the exposure time determine by the release period of the shutter 19, are output as a signal, corresponding to the generated photoelectric charges, in response to vertical transfer driving and horizontal transfer driving exerted by a pulse driver 15. The output from the solid-state imaging device 12 is converted into a predetermined video signal in a signal processing circuit 13, and the signal thus converted is transferred to a recording system 25, where it is recorded on a disc, a memory or the like as still-image data for one frame.

The solid-state imaging device 12 has the structure shown in FIG. 1, and the p-type region 2 is fixed to a predetermined potential $V_{SS}$. The electrode 1A of the n-type silicon substrate 1 shown in FIG. 1 the overflow drain electrode, consists of n electrode segments. These n electrode segments are respectively connected to photometric amplifiers 16-1, . . . , 16-n provided in a photometric circuit 16. These photometric amplifiers 16-1, . . . , 16-n are arranged to effect current-to-voltage conversion as well as logarithmic compression. Outputs Vp1 to Vpn from the photometric amplifiers 16-1 to 16-n are input to a microprocessor (MPU) 18 over an interface circuit 17. On the basis of the outputs Vp1 to Vpn, a sequence of processes which are associated with photographing operation step, from photometry executed measuring to exposure control and recording of image data, is performed under programmed control of the microprocessor 18.

The solid-state imaging device 12 is provided with a selecting switch 22 for effecting switching between an electrical source $V_{DD}$ and the predetermined potential $V_{SS}$. The signal processing circuit 13 is provided with a switch 23 for effecting switching between an electrical source $V_{CC}$ and the predetermined potential $V_{SS}$. With respect to the photometric amplifiers 16-1 to 16-n of the photometric circuit 16, a selecting switch 24 is provided for effecting switching between the bias source $V_{SUB}$ and the predetermined potential $V_{SS}$. The microprocessor 18 is arranged to receive a release signal issued in response to the operation of pressing a shutter release button, and also to provide control over the shutter 19 and aperture control over the photographic lens 21 through the interface circuit 20.

A sequence of photographic operations including photometric control will be explained with reference to FIG. 5.

First of all, in order to perform a photometric operation prior to exposure control, the switches 22 and 23 are switched to the respective $V_{SS}$ sides to stop the driving of the solid-state imaging device 12. At the same time, the switch 24 is switched to the $V_{SS}$ side to place the solid-state imaging device 12 in a non-biased state. In such a state that the driving of the solid-state imaging device 12 has completely stopped, electrical currents flowing from the individual overflow-drain electrode segments of the solid-state imaging device 12 are measured by the corresponding photometric amplifiers 16-1 to 16-n. The microprocessor 18 sequentially reads the measurement output voltages Vp1 to Vpn through the interface circuit 17 and stores them in a RAM or the like on the microprocessor 18. As a matter of course, during the photometric operation, the shutter 19 is open under the control of the processor 18 through the interface circuit 20.

Subsequently, when the shutter release button is fully pressed and a release signal is applied to the microprocessor 18, the microprocessor 18 temporarily closes the shutter 16. In the closed state of the shutter 19, the switches 22, 23 and 24 are switched to the $V_{DD}$ side, the $V_{CC}$ side and the bias-supply $V_{SUB}$ side, respectively, and the solid-state imaging device 12, the signal processing circuit 13 and the recording system 25 are each placed in an operative state.

Then, the microprocessor 18 carries out aperture control of the photographing lens 21 and drives the shutter 19 in accordance with the aperture value and the shutter speed both of which are required to assure the amount of exposure determined by the photometric value previously obtained from the photometric circuit 16. After the shutter 19 has been closed, the microprocessor 18 reads from the solid-state imaging device 12 a signal output which represents the number of photoelectric charges accumulated in accordance with the brightness of the object to be photographed, and causes the signal processing circuit 13 to apply predetermined signal processing to the read signal output, thereby converting it into a video signal. This video signal is delivered to the recording system 25, where still-image data for one frame is recorded.

Figure 6:
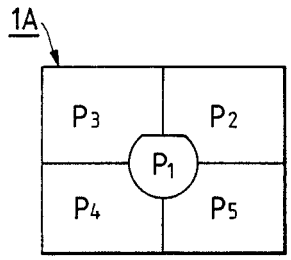
FIG. 6 is a schematic view showing the manner of division of the CCD overflow drain electrode used in the photometric apparatus of the present invention.

FIG. 6 is a schematic view showing an example of the overflow drain electrode of the solid-state imaging device of FIG. 5. The electrode 1A, which is formed to cover the entire surface of the n-type silicon substrate 1 which constitutes the reverse surface of the CCD device as shown in FIG. 1, consists of five electrode segments P1 to P5. As shown, the central electrode segment P1 has an approximately circular configuration and the neighboring four electrode segments P2 to P5 each have an approximately rectangular configuration. For example, if the center-weighted metering mode is selected, the amount of exposure may be determined on the basis of the photometric result obtained from the center electrode segment P1. If the average metering mode is selected, the photometric outputs from all the electrode segments P1 to P5 may be utilized.

In this arrangement, it is possible to arbitrarily determine the number of electrode segments of the vertical overflow drain electrode and the pattern of division thereof. However, needless to say, such electrode segments should be formed to cover substantially the entire surface of the vertical overflow drain of the CCD device. If it is assumed that an electrode pattern is formed on only a particular portion in accordance with an arbitrary photometric pattern of an imaging surface, a potential gradient occurs between the portion on which the electrode pattern is formed and the portion on which no electrode pattern is formed. As a result, even if the solid-state imaging device is operated, the sufficient effect of overflow drain may not be obtained. For this reason, it is desirable that the electrode segments of the overflow drain electrode be formed to cover the entire surface of the device.

Although the embodiment shown in FIG. 5 employs a mechanical shutter, it is also possible to adopt as the shutter a solid-state imaging device capable of purely electronically realizing a shutter function. If such an imaging device is employed, the shutter 19, hence the shutter control, can be omitted.

As described above, in the photometric apparatus according to the present invention, since photometry is performed by using the solid-state imaging device for imaging purposes, a separate photometric sensor or a separate optical system is not needed. In addition, even while the solid-state imaging device for imaging purposes is being used for photometric purposes, the driving of the solid-state imaging device itself is completely stopped and the signal processing circuit itself does not operate. For this reason, the photometric apparatus according to the present invention can effect photometry with an extremely small amount of power dissipation and, although the solid-state image device for imaging purposes is utilized for photometry, there is no risk of reducing the operational life of batteries.

In addition, since the vertical overflow drain electrode consists of electrode segments, it is possible to readily realize multi-pattern photometry with a simple structure and without the need for critical techniques for processing extremely fine portions.

What is claimed is:

1. A photometric apparatus comprising:
   a solid-state imaging device provided with a vertical overflow drain formed from the substrate of said solid-state imaging device;
   means for placing said solid-state imaging device in a non-driven state wherein the driving thereof is stopped; and
   means for measuring a photoelectric current which flows into said vertical overflow drain in the non-driven state of said solid-state imaging device.

2. A photometric apparatus according to claim 1, wherein said overflow drain is provided with a drain electrode formed on the surface of said substrate which is opposite to a photoconductive surface of said solid-state imaging device, said drain electrode being made up of electrode regions which are divided in correspondence with a plurality of photometric regions within the photosensitive area of said solid-state imaging device, said measuring means being arranged to individually measure the photoelectric currents flowing from said respective electrode regions.

3. A photometric apparatus according to claim 1, wherein said non-driven state of said solid-state imaging device is created by stopping transfer of a pixel signal output from a photo-sensitive pixel within said photosensitive area and deenergizing a bias voltage applied to said vertical overflow drain.

4. A photometric apparatus according to claim 2, wherein said non-driven state of said solid-state imaging device is created by stopping transfer of a pixel signal output from a photo-sensitive pixel within said photosensitive area and deenergizing a bias voltage applied to said vertical overflow drain 5. A photometric apparatus according to claim 2 or 4, wherein said measuring means individually measures the photoelectric currents flowing from said respective electrode regions, then weights the measured values and then determines a value corresponding to the brightness of an object.

6. A photometric apparatus according to claim 1, 2, 3 or 4, wherein said solid-state imaging device transfers said pixel signal output from said photosensitive pixel by means of an interline-type transfer arrangement.

7. A photometric apparatus according to claim 6, wherein the interline-type transfer arrangement of said solid-state imaging device includes a CCD.

8. A photometric apparatus comprising:
(a) a solid-state imaging device including a plurality of photosensitive devices, said photosensitive devices each comprising:
an n-type semiconductor substrate which forms an overflow drain region;
an n-type first semiconductor region which extends in a predetermined direction along the surface of said photosensitive device which is located on a photosensitive side thereof, said first semiconductor region serving to generate electric charges according to the intensity of illumination;
a p-type second semiconductor region which is positioned along said surface located on said photosensitive side and adjacent to said first region;
an n-type third semiconductor region which is positioned along said surface located on said photosensitive side and adjacent to said second region;
a p-type fourth semiconductor region positioned between said semiconductor substrate and said second region to form a potential barrier;
said first semiconductor region having a conduction band whose end is at a first potential level so as to accumulate said electric charges;
said second semiconductor region having a conduction band whose end is at a second potential level higher than said first potential level;
said third semiconductor region having a conduction band whose end is at a third potential level lower than said second potential level;
said fourth semiconductor region having a conduction band whose end is at a fourth potential level higher than said first potential level and lower than said second potential level; and
said substrate having a conduction band whose end is at a fifth potential level lower than said fourth potential level;
(b) means for placing said solid-state imaging device in a non-driven state wherein the driving thereof is stopped; and
(c) means for measuring a photoelectric current which flows into said vertical overflow drain in the non-driven state of said solid-state imaging device.

9. A photometric apparatus comprising:
(a) a solid-state imaging device including a plurality of photosensitive devices, said photo-sensitive devices each comprising:
a p-type semiconductor substrate which forms an overflow drain region;
a p-type first semiconductor region which extends in a predetermined direction along the surface of said photosensitive device which is located on a photosensitive side thereof, said first semiconductor region serving to generate electric charges according to the intensity of illumination;
an n-type second semiconductor region which is positioned along said surface located on said photosensitive side and adjacent to said first region;
a p-type third semiconductor region which is positioned along said surface located on said photosensitive side and adjacent to said second region;
an n-type fourth semiconductor region positioned between said semiconductor substrate and said second region to form a potential barrier;
said first semiconductor region having a valence band whose end is at a first potential level so as to accumulate said electric charges;
said second semiconductor region having a valence band whose end is at a second potential level lower than said first potential level;
said third semiconductor region having a valence band whose end is at a third potential level higher than said second potential level;
said fourth semiconductor region having a valence band whose end is at a fourth potential level lower than said first potential level and higher than said second potential level; and
said substrate having a conduction band whose end is at a fifth potential level higher than said fourth potential level;
(b) means for placing said solid-state imaging device in a non-driven state wherein the driving thereof is stopped; and
(c) means for measuring a photoelectric current which flows into said vertical overflow drain in the non-driven state of said solid-state imaging device.

10. A photometric apparatus according to claim 8 or 9, wherein said substrate is provided with a drain electrode formed on its surface which is opposite to a photoconductive surface of said solid-state imaging device, said drain electrode being made up of electrode regions which are divided in correspondence with a plurality of photometric regions within the photosensitive area of said solid-state imaging device, said measuring means being arranged to individually measure the photoelectric currents flowing from said respective electrode regions.

11. A photometric apparatus according to claim 8 or 9, wherein said non-driven state of said solid-state imaging device is created by stopping transfer of a charge signal output from said first semiconductor region defined with respect to each photosensitive device on said photoconductive surface and de-energizing a bias voltage applied to said substrate.

12. A photometric apparatus according to claim 10, wherein said non-driven state of said solid-state imaging device is created by stopping transfer of a charge signal output from said first semiconductor region defined with respect to each photosensitive device on said photoconductive surface and de-energizing a bias voltage applied to said substrate.

13. A photometric apparatus according to claim 10, wherein said measuring means individually measures the photoelectric currents flowing from said respective electrode regions, then weights the measured values and then determines a value corresponding to the brightness of an object.

14. A photometric apparatus according to claim 11, wherein said solid-state imaging device transfers, by means of an interline-type transfer arrangement, said charge signal output from said first semiconductor region defined with respect to each photosensitive device.

* * * * *

UNITED STATES PATENT AND TRADEMARK OFFICE
CERTIFICATE OF CORRECTION

PATENT NO. : 4,977,312
DATED : December 11, 1990
INVENTOR(S) : Masahiro Juen

It is certified that error appears in the above-identified patent and that said Letters Patent is hereby corrected as shown below:

In the drawings, sheet 3, Fig. 5, an arrow should be applied showing an input to MPU 18 from INTERFACE CKT. 17.

Signed and Sealed this

Thirteenth Day of October, 1992

Attest:

DOUGLAS B. COMER

Attesting Officer     Acting Commissioner of Patents and Trademarks